(12) United States Patent
Schirck

(10) Patent No.: US 11,070,450 B2
(45) Date of Patent: Jul. 20, 2021

(54) NETWORK TAP WITH CLOCK ADAPTATION

(71) Applicant: Profitap HQ B.V., Eindhoven (NL)

(72) Inventor: Laurent Schirck, Mol (BE)

(73) Assignee: PROFITAP HQ B.V., Eindhoven (NL)

( * ) Notice: Subject to any disclaimer, the term of this patent is extended or adjusted under 35 U.S.C. 154(b) by 0 days.

(21) Appl. No.: 16/126,572

(22) Filed: Sep. 10, 2018

(65) Prior Publication Data

US 2019/0081870 A1    Mar. 14, 2019

Related U.S. Application Data

(60) Provisional application No. 62/556,827, filed on Sep. 11, 2017.

(30) Foreign Application Priority Data

Sep. 11, 2017 (EP) .................................. 17190380

(51) Int. Cl.
*H04L 12/26* (2006.01)
*H03L 7/085* (2006.01)
*H04L 29/14* (2006.01)

(52) U.S. Cl.
CPC .............. *H04L 43/00* (2013.01); *H03L 7/085* (2013.01); *H04L 43/12* (2013.01); *H04L 69/40* (2013.01); *H04L 43/0817* (2013.01)

(58) Field of Classification Search
CPC ......... H04L 43/00; H04L 43/12; H04L 43/50; H03L 7/099; H03L 7/085; H04J 3/0635; H04J 3/0638; H04J 3/0641; H04J 3/0644; H04J 3/0658; H04J 3/0673; H04J 3/0676;
(Continued)

(56) References Cited

U.S. PATENT DOCUMENTS 6,424,627 B1 * 7/2002 Sørhaug .................. H04L 43/00
 370/241
2007/0002754 A1    1/2007 Matityahu et al.
2007/0171966 A1    7/2007 Light et al.
(Continued)

OTHER PUBLICATIONS

ICS1886, FDDI/Fast Ethernet PHYceiver, ICS1886RevC120996, Integrated Circuit System, Inc. (Year: 1996).*
(Continued)

*Primary Examiner* — Ario Etienne
*Assistant Examiner* — Kamal Hossain
(74) *Attorney, Agent, or Firm* — Steven M. Koehler; Westman, Champlin & Koehler

(57) ABSTRACT

A network tap includes a first network connector, a second network connector, a third network connector for connecting to a monitoring device, a phase locked loop, and circuitry. The circuitry is configured to extract a clock signal from a first signal on an output of one of the first and second network connectors, provide the clock signal to the phase locked loop, receive a reference clock signal derived from the recovered clock signal from the phase locked loop and clock a second signal on the input of the other one of the first and second network connectors using the received reference clock signal if a link has been established between a first network device and the first network connector and a link has been established between a second network device and the second network connector.

8 Claims, 6 Drawing Sheets

(58) Field of Classification Search
CPC ...... H04J 3/0679; H04J 3/0682; H04J 3/0685; H04J 3/0688
See application file for complete search history.

(56) References Cited

U.S. PATENT DOCUMENTS

| | | |
|---|---|---|
| 2007/0253349 A1 | 11/2007 | Light et al. |
| 2008/0013467 A1 | 1/2008 | Light et al. |
| 2008/0014879 A1 | 1/2008 | Light et al. |
| 2010/0177644 A1* | 7/2010 | Kucharczyk ........ H04L 41/0681 370/250 |
| 2016/0277137 A1* | 9/2016 | Robitaille ............. H04J 3/0641 |

OTHER PUBLICATIONS

European Search Report, dated Mar. 19, 2018 for corresponding European Patent Application No. 17190380.0, filed Sep. 11, 2017.

\* cited by examiner

NETWORK TAP WITH CLOCK ADAPTATION

FIELD OF THE INVENTION

The invention relates to a network tap.
The invention further relates to a system comprising said network tap.

BACKGROUND OF THE INVENTION

A network tap is a hardware device with takes a copy of the network traffic/frames and provides them to a monitoring device. A network tap has at least three ports: a first network port for connecting a first network device, a second network port for connecting a second network device and a third network port for connecting a monitoring device. The tap is inserted between the first network device and the second network device and allows all traffic to pass through it unimpeded in real-time, but further copies this traffic to the third network port, enabling the monitoring device to monitor this traffic. A network tap is passive in the meaning of having the lowest impact on the monitored network devices. The network tap should not cause connection outage or cause performance (e.g. bit error rate) degradation. Network taps are commonly used for networking intrusion detection and network probes, amongst others.

SUMMARY OF THE INVENTION

In an advantageous embodiment a network tap which is capable of supporting 10 Gigabit Ethernet over twisted pair cables is provided.

In a first aspect of the invention, the (e.g. Ethernet) network tap comprises a first network connector for connecting to a first network device (e.g. via a twisted pair cable), a second network connector for connecting to a second network device (e.g. via a twisted pair cable), a third network connector for connecting to a monitoring device, a phase locked loop, and circuitry connecting an output of said first network connector to an input of said second network connector, an output of said second network connector to an input of said first network connector, an output of at least one of said first network connector and said second network connector to a input of said third network connector, an output of said circuitry to an input of said phase locked loop and an output of said phase locked loop to an input of said circuitry.

Said circuitry is configured to extract a clock signal from a first signal on an output of one of said first network connector and said second network connector, provide said clock signal to said phase locked loop, receive a reference clock signal derived from the recovered clock signal from said phase locked loop and clock a second signal on said input of the other one of said first network connector and said second network connector using said received reference clock signal if a link has been established between said first network device and said first network connector and a link has been established between said second network device and said second network connector. Said first network connector and said second network connector may be RJ-45 connectors, for example.

Auto-Negotiation signalling is required on 1 GBase-T and 10 GBase-T systems, as Gigabit Ethernet systems use Auto-Negotiation to establish master-slave timing control. 1 GBase-T and 10 GBase-T slave device will recover the clock from the data, to clock its own transmitters. The master-slave preference is not set by the user but defined by the type of network device. Multiport devices (switches) are often set to prefer to act as master and single port devices (network cards) are often set to prefer to act as slave. By clocking the second signal in the manner described above, certain network performance degradations caused by the conventional network tap design are avoided.

Said network tap may further comprise a free running clock coupled to said phase locked loop and said circuitry may be configured to receive a reference clock signal derived from a clock signal of said free running clock from said phase locked loop and use said reference clock signal to establish a link between said first network device and said first network connector and a link between said second network device and said second network connector. This allows the network tap to clock its transmitters until links with the network devices can be established.

Said circuitry may be configured to clock said second signal using said reference clock signal derived from said recovered clock signal even if said first signal does not instruct said network tap to pass a synchronization signal in said first signal on to said second signal. Thus, the network tap synchronizes the clocks of the first and second network ports even if Synchronous Ethernet (SyncE; TU-T G.261) does not need to be supported.

Said circuitry may be configured to clock said second signal using said reference clock signal derived from said recovered clock signal even if said first signal is received from a network device which receives a clocked input signal from a further network device on a network connector connected to a network port which is configured to act as slave and which does not use said clocked input signal to clock said first signal. Thus, the network tap synchronizes the clocks of the first and second network ports even if Synchronous Ethernet (SyncE; TU-T G.8261) does not need to be supported.

The network tap may comprise one or more further network connectors in addition to said first, second and third network connectors, e.g. to allow more network devices and/or monitoring devices to be connected. For example, the network tap may further comprise a fourth network connector for connecting to a further monitoring device and said circuitry may connect said output of said first network connector to said input of said third network connector and said output of said second network connector to an input of said fourth network connector. This configuration is typically used in Layer 1 network taps.

Said circuitry may comprise a transceiver and a microcontroller configured to control said transceiver. Said circuitry further may comprise a fail-safe circuit configured to connect said output of said first network connector to said input of said second network connector and said output of said second network connector to said input of said first network connector without said output of said first network connector and said output of said second network connector reaching said transceiver in a failure mode. This avoids network disruption if the network tap no longer receives power, e.g. from the power grid or from a battery (e.g. UPS), and the circuits of the network tap which require power can no longer function. If the network tap no longer receives power, the monitoring device will not be able to monitor the traffic passing through the network tap.

Said circuitry may be configured to force a network port connected to one of said first network connector and said second network connector to act as slave and a network port connected to the other one of said first network connector and said second network connector to act as master. This may be used to implement the invention in a 1 Gigabit Ethernet network tap or a 10 Gigabit Ethernet network tap, for example. In a conventional network tap, the network tap does not force a network port to act as master or server. In other words, the network ports are not set to a master or server role independent of any signal received from a further device.

In a second aspect of the invention, a system comprises said network tap and said further network device.

BRIEF DESCRIPTION OF THE DRAWINGS

These and other aspects of the invention are apparent from and will be further elucidated, by way of example, with reference to the drawings, in which.

Corresponding elements in the drawings are denoted by the same reference numeral.

DETAILED DESCRIPTION OF THE DRAWINGS

Figure 1:
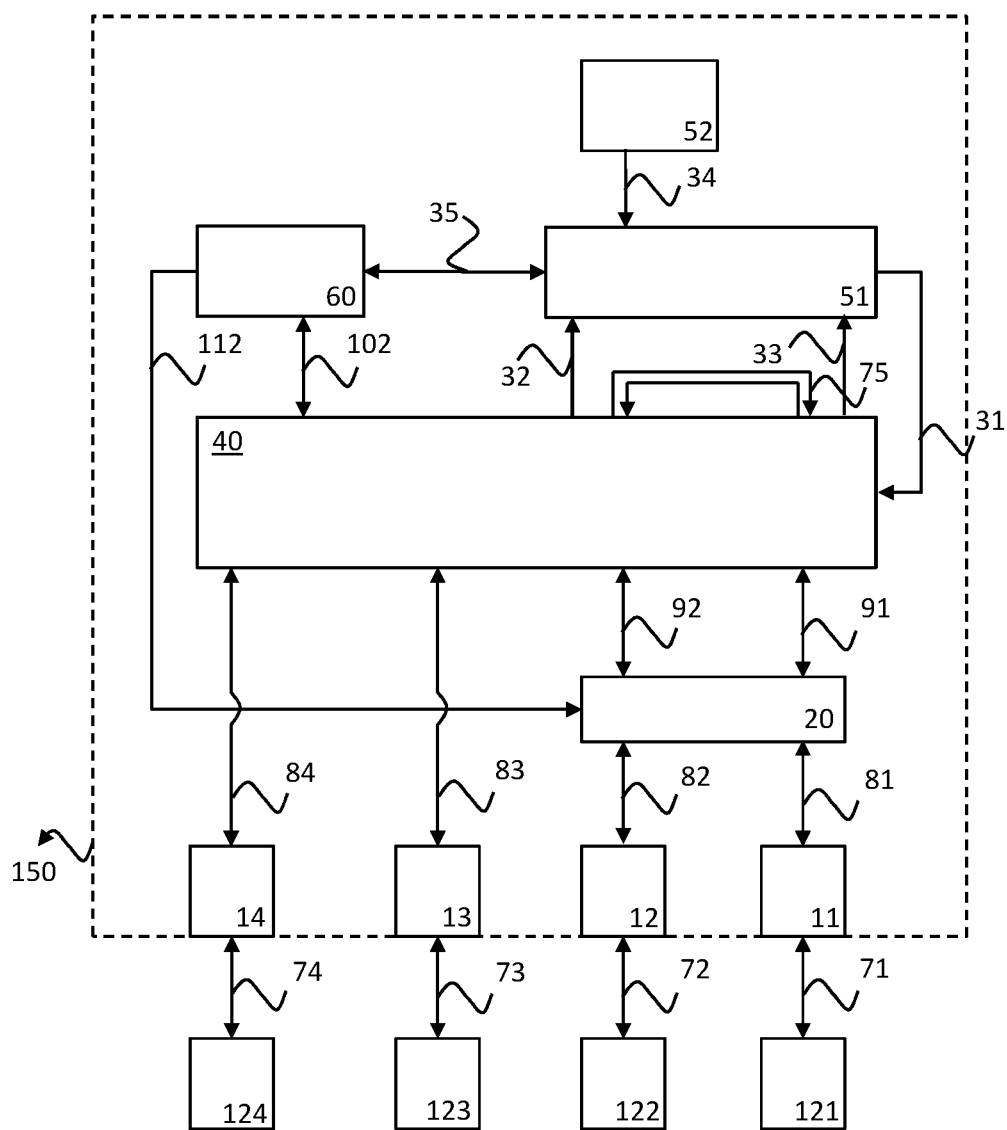
FIG. 1 is a block diagram of an embodiment of the network tap.

In an embodiment of the network tap of the invention, see FIG. 1, a network tap 150 comprises a first network connector 11 for connecting to a first network device 121, a second network connector 12 for connecting to a second network device 122, a third network connector 13 for connecting to a monitoring device 123, a phase locked loop 51, and circuitry.

The circuitry connects an (internal) output of the first network connector 11 to an (internal) input of the second network connector 12, an (internal) output of the second network connector 12 to an (internal) input of the first network connector 11, an (internal) output of at least one of the first network connector 11 and the second network connector 12 to an (internal) input of the third network connector 13. The circuitry further connects an output of the circuitry to an input of the phase locked loop (PLL) 32 and an output of the phase locked loop 51 to an input of the circuitry. In the embodiment of FIG. 1, the first network connector 11 and the second network connector 12 are RJ-45 connectors.

In the embodiment of FIG. 1, the network tap 150 is a layer-1 tap. The network tap 150 further comprises a fourth network connector 14 for connecting to a further monitoring device 124. The circuitry connects the (internal) output of the first network connector 11 to the (internal) input of the third network connector 13 and the (internal) output of the second network connector 12 to an (internal) input of the fourth network connector 14.

In the embodiment of FIG. 1, the circuitry comprises a transceiver (PHY) 40 and a microcontroller 60 configured to control the transceiver 40. The circuitry further comprises a fail-safe circuit 20 configured to connect the (internal) output of the first network connector 11 to the (internal) input of the second network connector 12 and the (internal) output of the second network connector 12 to the (internal) input of the first network connector 11 without the output of the first network connector 11 and the output of the second network connector 12 reaching the transceiver 40 in a failure mode.

In the embodiment of FIG. 1, the circuitry further comprises connections 31, 32 and 33 between the phase locked loop 51 and the transceiver 40 for transporting clock signals and a connection 35, e.g. using an I²C bus, between the microcontroller 60 and the phase locked loop 51. The circuitry further comprises connections 91 and 92, e.g. using an MDI interface, between the transceiver 40 and the fail-safe circuit 20 and a connection 112 between the microcontroller 60 and the fail-safe circuit 20. The circuitry further comprises a connection 102, e.g. using an MDIO/MDIO Clause 45 interface, between the microcontroller 60 and the transceiver 40. The microcontroller 60 may provide firmware and a configuration for the phase locked loop 51 over the connection 35. The configuration may specify a multiplier and a divider, specify how the PLL 51 should react when no clock signal is present on connections 32 and 33 and/or specify priorities for selecting one of the clock signals received over connections 32-34, for example. If an FPGA, CPLD or clock distribution circuit is used, clock signal 31 can be made from clock signals 34 and 32 without clock multiplication.

The circuitry further comprises a connection 81, e.g. using an MDI interface, between the fail-safe circuit 20 and the first network connector 11, a connection 82, e.g. using an MDI interface, between the fail-safe circuit 20 and the first network connector 12, a connection 83, e.g. using an SFI interface, between transceiver 40 and the third network connector 13, and a connection 84, e.g. using an SFI interface, between transceiver 40 and the fourth network connector 14. The circuitry further comprises a connection 75 which connects the transceiver 40 to itself, e.g. using an XFI interface.

Connection 71 connects the first network connector 11 to the first network device 121, e.g. via an MDI interface. Connection 72 connects the second network connector 12 to the second network device 122, e.g. via an MDI interface. Connection 73 connects the third network connector 13 to the monitoring device 123. Connection 74 connects the fourth network connector 14 to the further monitoring device 124.

The circuitry is configured to extract a clock signal from a first signal on an output of one of the first network connector 11 and the second network connector 12, provide the clock signal to the phase locked loop 51, receive a reference clock signal derived from the recovered clock signal from the phase locked loop 51 and clock a second signal on the input of the other one of the first network connector 11 and the second network connector 12 using the received reference clock signal if a link has been established between the first network device 121 and the first network connector 11 and a link has been established between the second network device 122 and the second network connector 12, i.e. if both links are up.

In the embodiment of FIG. 1, the network tap 150 further comprises a free running clock 52 coupled to the phase locked loop 51. The circuitry is configured to receive a reference clock signal derived from a clock signal of the free running clock from the phase locked loop 51 and use the reference clock signal to establish a link between the first network device 121 and the first network connector 11 and a link between the second network device 122 and the second network connector 12 (when the links are down). The free running clock 52 is connected to the phase locked loop 51 via connection 34.

The tap 150 is used in network monitoring. It is passive in the meaning of having the lowest possible impact on the monitored network link. Undesirable effects might be connection outage, BER performance degradation, packet loss or lack of isolation from monitor to network. The tap 150 comprises multiple pairs of connectors: two RJ45 connectors 11 and 12 for in-line connectivity and two SFP+ cages 13 and 14 for monitoring.

The tap 150 can be in two different states: normal operation and failure mode. The tap 150 enters in failure mode when a critical event occurs, to preserve network segment connectivity. Examples of critical events are power outage on the tap, PHY error or any other event which might alter the network connectivity. When the tap 150 is in failure mode, the network data path is assured by the fail-safe circuit 20. The fail-safe circuit 20 may comprise electromechanical relays or electromechanical relays and analog switches, for example. It creates a connection between the first and second network devices 121 and 122 and isolates the transceiver 40 from the network segment, i.e. creates an open circuit between connections 81 and 91 and between connections 82 and 92 and a short circuit between connections 81 and 82.

Figure 2:
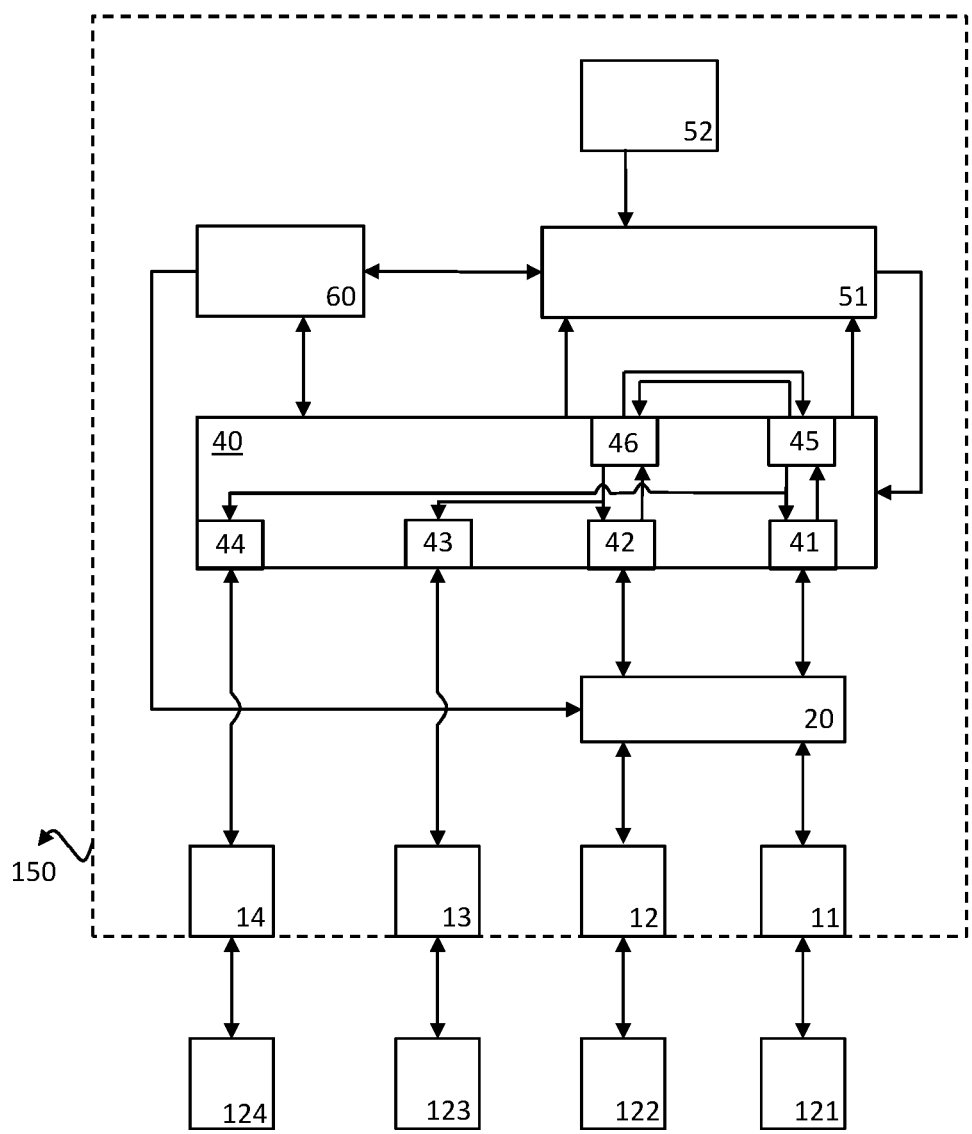
FIG. 2 is a block diagram of the embodiment of FIG. 1 with more details of the transceiver.

The microcontroller 60 may be a suitably programmed Microchip PIC32 MCU, for example. The transceiver 40 may be a Marvell Alaska 88X3220 or 88X3240 10 GBASE-T PHY, for example. More details of the transceiver 40 are shown in FIG. 2. The transceiver 40 comprises two T (i.e. 10 GBASE-T) units 41 and 42, two X units 43 and 44 with an SFI interface and two M (i.e. MAC interface) units 45 and 46.

A link is considered to be established between the first network device 121 and the first network connector 11 if a link is established between the T unit 41 and the first network device 121. A link is considered to be established between the second network device 122 and the second network connector 12 if a link is established between the T unit 42 and the second network device 122.

The circuitry is configured to force network port 41 connected to one of the first network connector 11 and network port 42 connected to second network connector 12 to act as slave and the network port connected to the other one of the first network connector 11 and the second network connector 12 to act as master (independent of any signal received from a further device). Conventionally, the master-slave preference would not be set by the user, but defined by the type of network device. Multiport devices (switches) are often set to prefer to act as master and single port devices (network cards) are often set to prefer to act as slave. If two sides of a link have the same preference, the roles would be randomly chosen.

In a first embodiment of the network tap 150, always the same network port is forced to act as master and the same network port is forced to act as slave. In this case, only a clock signal extracted on one of the network ports needs to be provided to the PLL 51. In order to create a synchronous network, the network device providing the master clock needs to be connected to the appropriate slave network connector.

In a second embodiment of the network tap 150, each network port can be either forced to act as master or as slave (e.g. using SyncE functionality of a transceiver). In this case, a clock signal may be extracted on each network port and provided to the PLL 51 and the PLL 51 is configured to select and use the clock signal of the network port acting as slave. Initially, one of the network ports is forced to act as master and the other network port is forced to act as slave. When the network device providing the master clock is connected to the master network connector (and thus, no synchronous network is created), the circuitry detects this after a certain time and configures the network port acting as master to act as slave and the network port acting as slave to act as master.

In normal operation, links must be established between second network device 122 and T unit 42 and between first network device 121 and T unit 41. Initial auto-negotiation parameters are set in the registers of transceiver/PHY 40. registers are controlled by the microcontroller 60 and accessible via the MDIO connection/interface 35. T unit 41 is forced to be master (i.e. to be the provider of the link's clock). T unit 42 is forced to be slave (i.e. to clock its BASE-T transmitter with the recovered clock extracted from the link). This setup forces the second network device 122 to establish the link as master and the second network device 122 to establish the link as slave.

Figure 3:
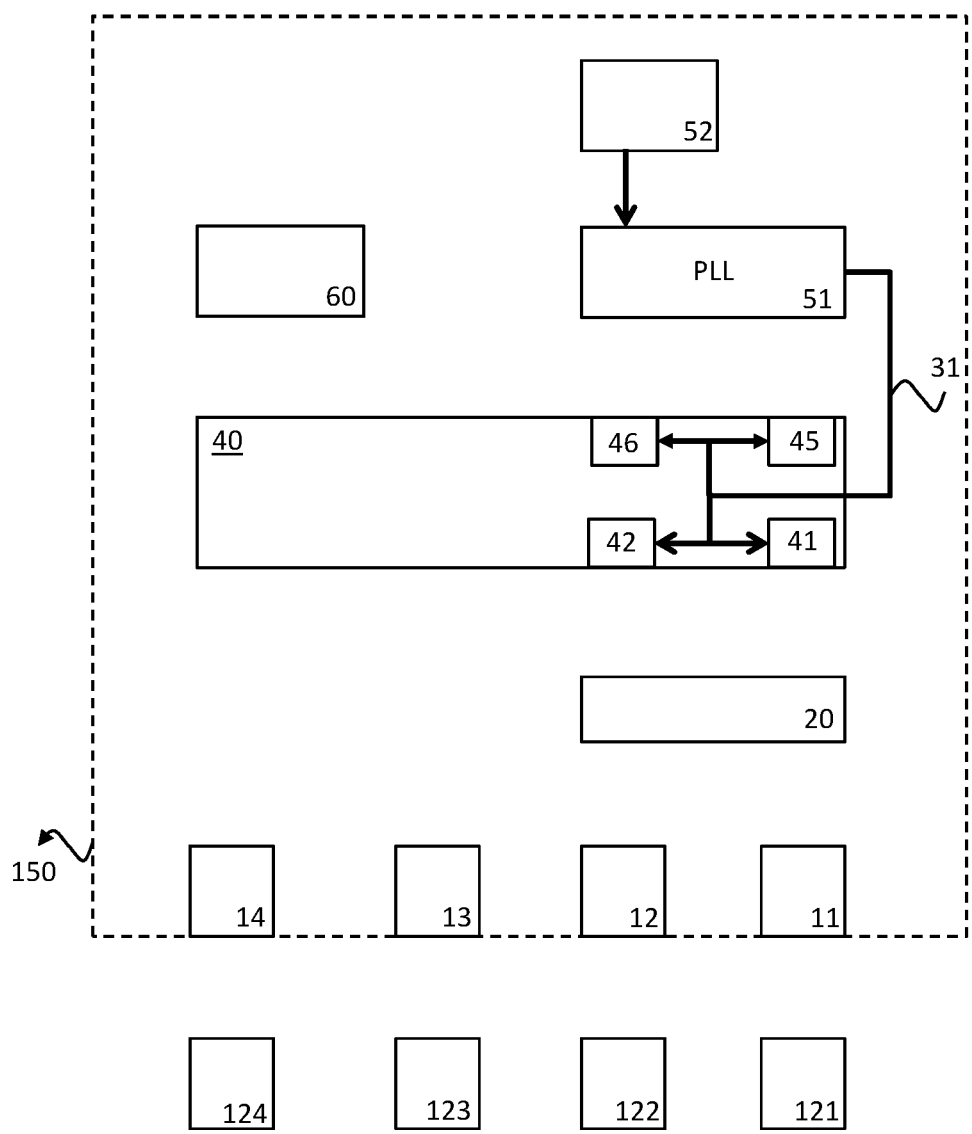
FIG. 3 illustrates the determination of a reference clock signal in a first stage of operation of the network tap of FIG. 2.
Figure 4:
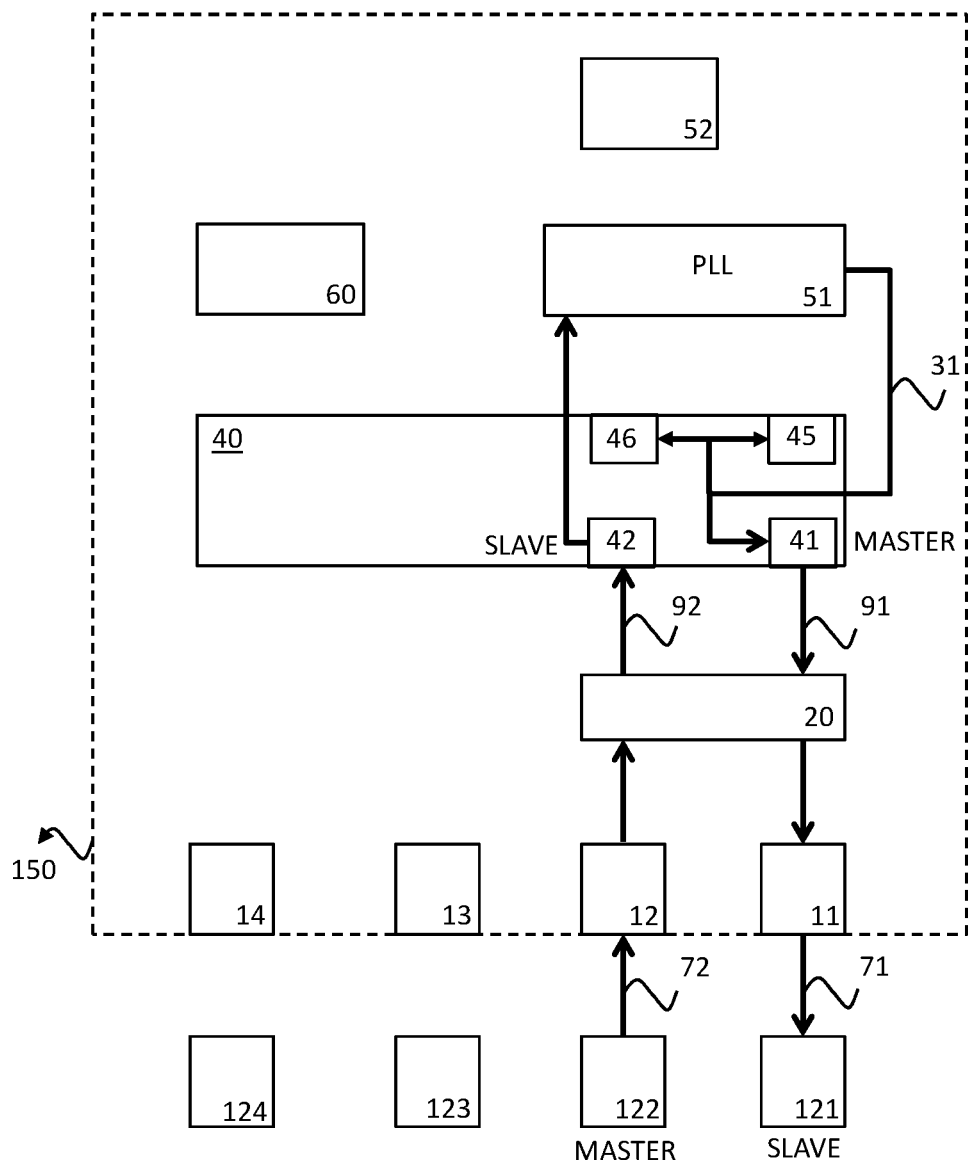
FIG. 4 illustrates the determination of a reference clock signal in a second stage of operation of the network tap of FIG. 2.

When T units 41 and 42 are linked down, the reference clock 31 is derived from the free running clock oscillator 52. This is shown in FIG. 3. When T units 41 and 42 are both linked up, T unit 42 is slave, data out on connection 92 is clocked by the recovered clock provided by the second network device 122 and data output by T unit 41 on connection 91 is clocked by the reference clock 31 received from the PLL 51. The microcontroller 60 reconfigures the PLL 51 to use T unit 42's recovered clock as the source to generate reference clock 31. This is shown in FIG. 4.

In this new clock topology, network connections 71 and 72 are synchronous. Furthermore, not only connections 71 and 72, but also network ports 45 and 46 and data loop 75 are synchronous, because the reference clock 31 clocks the whole transceiver 40. This clock topology makes a layer 1 Tap for 10 GBASE-T network possible, without network performances degradations. Since there are CTC (Clock Tolerance Compensation) FIFO buffers in T units 41 and 42, if the full path is not synchronized in this way, those FIFO buffers will be used to absorb with more or less success PPM (parts per million) differences between reference clocks of the first network device 121, the second network device 122 and phase locked loop 51. In most applications (e.g. switches, network cards and routers), a MAC is connected to the PHY. A PHY to PHY connection only exists in Layer 1 tap design, and the succession of clock domain crossing (without clock synchronization) might degrade the BER performances.

When the tap 150 is in normal operation, the network connectivity is assured by transceiver/PHY 40 and the inline data loop 75, see FIG. 1. The traffic sent by the first network device 121 is replicated to monitoring device 123 and the traffic sent by the second network device 122 is replicated to further monitoring device 124, i.e. there is an open circuit between connections 81 and 82 and a short circuit between connections 81 and 91 and between connections 82 and 92.

Figure 5:
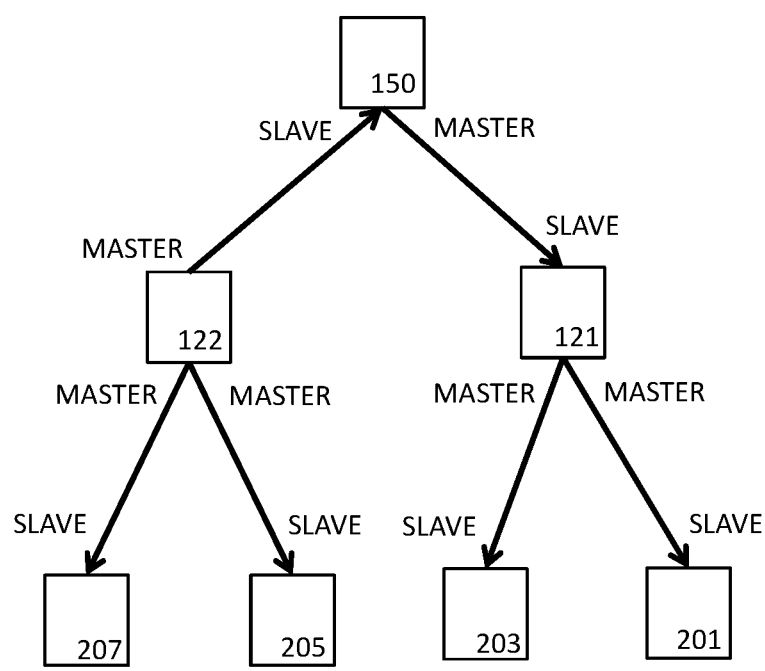
FIG. 5 shows a first example of master-server role settings in an embodiment of the system of the invention.
Figure 6:
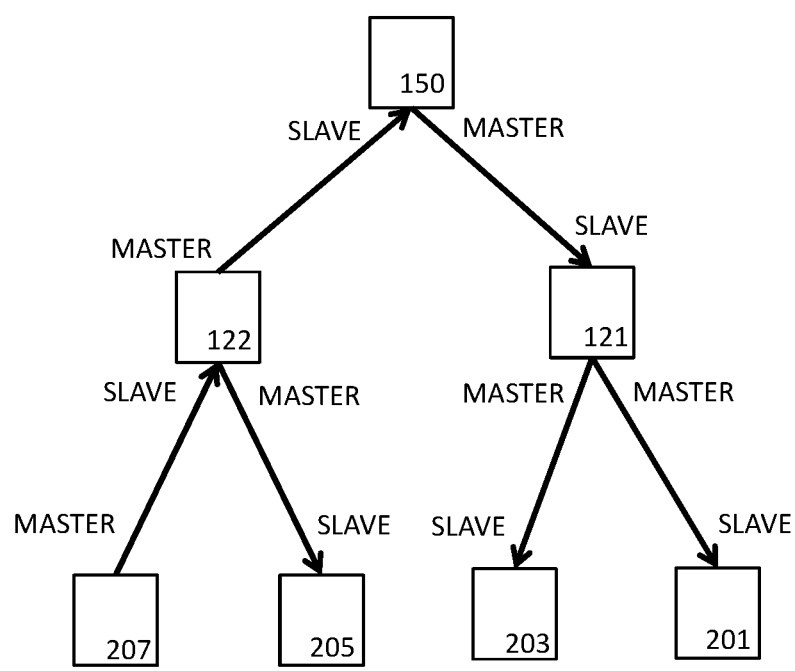
FIG. 6 shows a second example of master-server role settings in the embodiment of the system of FIG. 5.

FIGS. 5-6 show a system in which the network tap 150 may be used and indicates examples of the master-slave role settings of the network tap 150 and the network devices in the system. In FIG. 5, two network devices 205 and 207 act as slave and network device 122 acts as master with regard to these two devices. Furthermore, two network devices 201 and 203 act as slave and network device 121 acts as master with regard to these two devices. Network tap 150 acts as slave with regard to network device 122 and acts as master with regard to network device 121, as shown in FIG. 4.

In FIG. 6, network device 207 acts as master instead of slave and network device 122 acts as slave with regard to this device. The network device 207 sends the first signal to the network device 122. The network tap 150 is configured to clock the second signal using the reference clock signal derived from the recovered clock signal even if the first signal does not instruct the network tap to pass a synchronization signal in the first signal on to the second signal and even if the first signal is received from a network device (network device 122 in this example) which receives a clocked input signal from a further network device (network device 207 in this example) on a network port connected to a network connector which is configured to act as slave and which does not use the clocked input signal to clock the first signal.

The terminology used herein is for the purpose of describing particular embodiments only and is not intended to be limiting of the invention. As used herein, the singular forms "a," "an," and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of embodiments of the present invention has been presented for purposes of illustration, but is not intended to be exhaustive or limited to the implementations in the form disclosed. Many modifications and variations will be apparent to those of ordinary skill in the art without departing from the scope and spirit of the present invention. The embodiments were chosen and described in order to best explain the principles and some practical applications of the present invention, and to enable others of ordinary skill in the art to understand the present invention for various embodiments with various modifications as are suited to the particular use contemplated.

What is claimed is:

1. A network tap capable of multi gigabit speeds, comprising:
    a first network connector for connecting to a first network device;
    a second network connector for connecting to a second network device;
    a third network connector for connecting to a monitoring device;
    a phase locked loop; and
    circuitry connecting an output of said first network connector to an input of said second network connector, an output of said second network connector to an input of said first network connector, an output of at least one of said first network connector and said second network connector to an input of said third network connector, an output of said circuitry to an input of said phase locked loop and an output of said phase locked loop to an input of said circuitry, said inputs and outputs of said network connectors receiving and providing signals inside said network tap;
    wherein said circuitry is configured to:
        extract a clock signal from a first signal received from said output of said first network connector or said output of said second network connector;
        provide said clock signal to said phase locked loop;
        receive a reference clock signal derived from the extracted clock signal from said phase locked loop;
        clock a second signal to be provided to said input of the other one of said first network connector and said second network connector using said received reference clock signal when a link has been established between said first network device and said first network connector and a link has been established between said second network device and said second network connector; and
        force an internal network port connected to one of said first network connector and said second network connector to act as slave, and an internal network port connected to the other one of said first network connector and said second network connector to act as master, and wherein said first signal is received from said output of said network connector connected to said internal network port forced to act as slave and said second signal is provided to said output port of said network connector connected to said internal network port forced to act as master,
        and wherein said circuitry is configured to clock said second signal using said reference clock signal derived from said extracted clock signal when said first signal does not instruct said network tap to pass a synchronization signal in said first signal on to said second signal.

2. The network tap as claimed in claim 1, further comprising a free running clock coupled to said phase locked loop, wherein said circuitry is configured to receive a reference clock signal derived from a clock signal of said free running clock from said phase locked loop and use said reference clock signal to establish a link between said first network device and said first network connector and a link between said second network device and said second network connector.

3. The network tap as claimed in claim 1, wherein said circuitry is configured to clock said second signal using said reference clock signal derived from said extracted clock signal when said first signal is received from a network device which receives a clocked input signal from a further network device on a network connector connected to a network port which is configured to act as slave and which does not use said clocked input signal to clock said first signal.

4. The network tap as claimed in claim 1, further comprising a fourth network connector for connecting to a further monitoring device, wherein said circuitry connects said output of said first network connector to said input of said third network connector and said output of said second network connector to an input of said fourth network connector.

5. The network tap as claimed in claim 1, wherein said circuitry comprises a transceiver and a microcontroller configured to control said transceiver.

6. The network tap as claimed in claim 5, wherein said circuitry further comprises a fail-safe circuit configured to connect said output of said first network connector to said input of said second network connector and said output of said second network connector to said input of said first network connector without said output of said first network connector and said output of said second network connector reaching said transceiver in a failure mode.

7. The network tap as claimed in claim 1, wherein said circuitry is configured to force a network port connected to one of said first network connector and said second network connector to act as slave and a network port connected to the other one of said first network connector and said second network connector to act as master independent of any signal received from a further device.

8. The network tap as claimed in claim 1, wherein said first network connector and said second network connector are RJ-45 connectors.

\* \* \* \* \*